(12) United States Patent
Menon

(10) Patent No.: US 9,703,211 B2
(45) Date of Patent: Jul. 11, 2017

(54) SUB-DIFFRACTION-LIMITED PATTERNING AND IMAGING

(71) Applicant: University of Utah Research Foundation, Salt Lake City, UT (US)

(72) Inventor: Rajesh Menon, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 0 days.

(21) Appl. No.: 14/885,657

(22) Filed: Oct. 16, 2015

(65) Prior Publication Data
US 2016/0109811 A1     Apr. 21, 2016

Related U.S. Application Data

(60) Provisional application No. 62/064,800, filed on Oct. 16, 2014.

(51) Int. Cl.
*G03F 7/20* (2006.01)

(52) U.S. Cl.
CPC ...... *G03F 7/70425* (2013.01); *G03F 7/70325* (2013.01); *G03F 7/70466* (2013.01)

(58) Field of Classification Search
None
See application file for complete search history.

(56) References Cited

U.S. PATENT DOCUMENTS

| | | | |
|---|---|---|---|
| 7,666,580 B2 | 2/2010 | Menon et al. | |
| 7,667,819 B2 * | 2/2010 | Menon | G03F 7/2057 355/18 |
| 7,683,303 B2 | 3/2010 | Lincoln et al. | |
| 7,713,684 B2 | 5/2010 | Menon et al. | |
| 7,714,988 B2 | 5/2010 | Menon et al. | |
| 7,912,258 B2 | 3/2011 | Warmath et al. | |
| 7,959,779 B2 | 6/2011 | Colbert et al. | |
| 8,116,549 B2 | 2/2012 | Warmath et al. | |

(Continued)

FOREIGN PATENT DOCUMENTS

| | | | | |
|---|---|---|---|---|
| ES | WO 2008009931 A1 * | 1/2008 | | B82Y 10/00 |
| WO | WO2013/114075 | 8/2013 | | |

OTHER PUBLICATIONS

Huang et al., "Optical super-resolution through super-oscillations", Aug. 22, 2007, J. Opt. A: Pure Appl. Opt. 9 (2007) S285-S288.*

(Continued)

*Primary Examiner* — Steven H Whitesell Gordon
(74) *Attorney, Agent, or Firm* — Thorpe North & Western, LLP

(57) ABSTRACT

A method for sub-diffraction-limited patterning using a photoswitchable layer is disclosed. A sample of the photoswitchable layer can be selectively exposed to a first wavelength of illumination that includes a super-oscillatory peak. The sample can be selectively exposed to a second wavelength of illumination that does not include the super-oscillatory peak. A region in the sample that corresponds to the super-oscillatory peak and is associated with the second transition state can optionally be converted into a third transition state. The region in the sample at the third transition state can constitute a pattern of an isolated feature with a size that is substantially smaller than a far-field diffraction limit.

23 Claims, 17 Drawing Sheets

(56) References Cited

U.S. PATENT DOCUMENTS

| | | |
|---|---|---|
| 8,143,601 B2 | 3/2012 | Menon et al. |
| 8,207,323 B2 | 6/2012 | Frasch et al. |
| 8,502,143 B2 | 8/2013 | Hytch et al. |
| 8,549,732 B2 | 10/2013 | Burg et al. |
| 2010/0248159 A1 | 9/2010 | Menon et al. |
| 2013/0235180 A1* | 9/2013 | Rogers ............... G02B 21/0056 348/79 |

OTHER PUBLICATIONS

Ferreira et al, Construction of Aharonov-Berry's Superoscillations; J. Phys. A: Math Theor; vol. 40; Apr. 24, 2007; pp. 5141-5147.

Cantu et al, Subwavelength Nanopatterning of Photochromic Diarylethene Films; Applied Physics Letters; vol. 100 Issue 18: Apr. 30, 2012; pp. 183103-183103.3.

Brimhall et al, Breaking the Far-Field Field Diffraction Limit in Optical Nanopatterning Via Repeated Photochemical and Electrochemical Transitions in Photochemical Molecules; American Physcial Society (Aps); vol. 107 Issue 20; Nov. 7, 2011; pp. 205501-1/205501-5.

Rogers et al, A Super-Oscillatory Lens Optical Microscope for Subwavelength Imaging; Nature Material; vol. 11; Mar. 25, 2012; pp. 432-435.

Huang et al, Optical Super-Resolution Through Super-Oscillations; IOP; vol. 9 Issue 9; Aug. 22, 2007; pp. S285-S288.

Hell, Far-Field Optical Nanoscopy; American Association for the Advancement of Science; vol. 316 Issue 5828; May 25, 2007; pp. 1153-1158.

Liu, Far-Field Optical Hyperlens Magnifying Sub-Diffraction-Limited Objects; American Association for the Advancement of Science; vol. 315 Issue 5819; p. 1686.

U.S. Appl. No. 61/393,668; University of Utah; Filing Date: Oct. 15, 2010; 20 Pages.

U.S. Appl. No. 61/696,955; Univesity of Utah; Filing Date: Sep. 5, 2012; 28 Pages.

U.S. Appl. No. 61/667,386; University of Utah; Filing Date: Jul. 30, 2012; 17 pages.

* cited by examiner

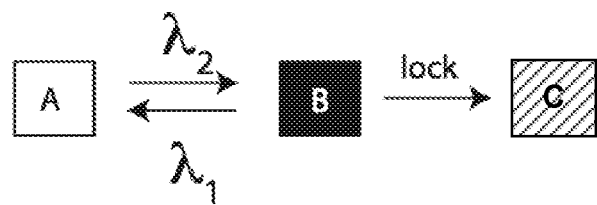
FIG. 1A
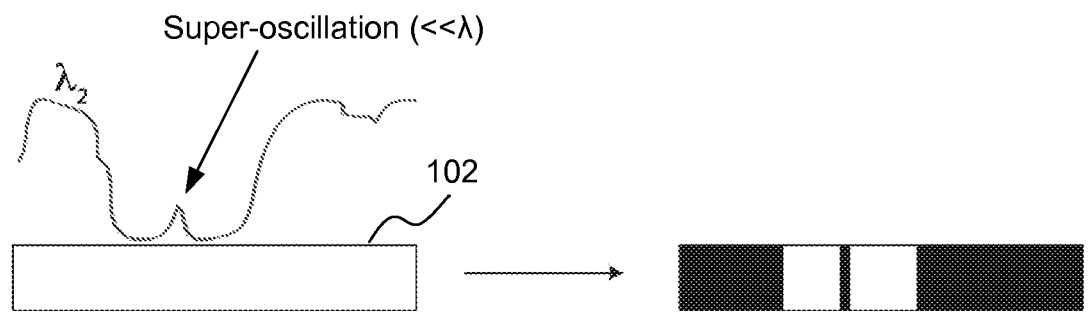
FIG. 1B
FIG. 1C
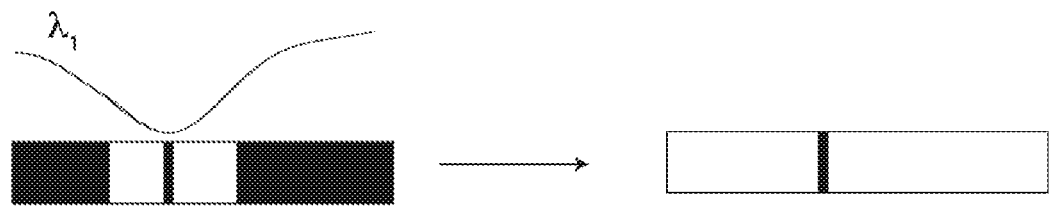
FIG. 1D
FIG. 1E
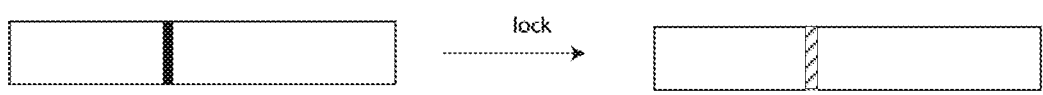
FIG. 1F
FIG. 1G

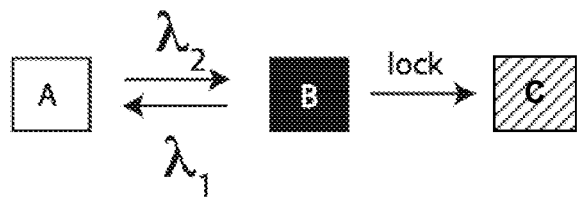
FIG. 2A
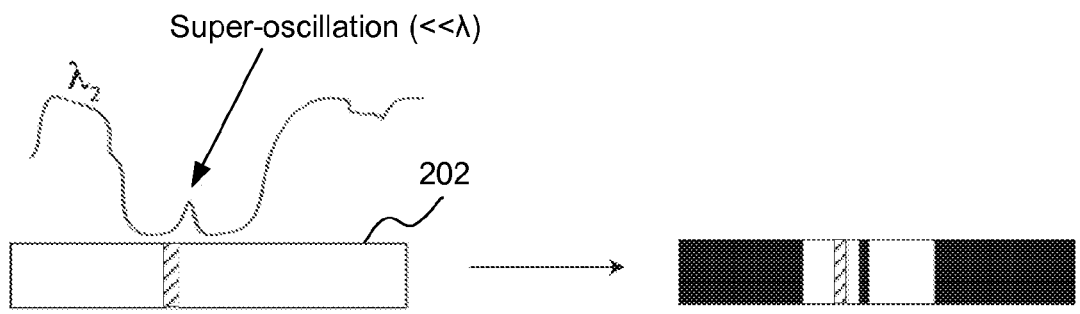
FIG. 2B
FIG. 2C
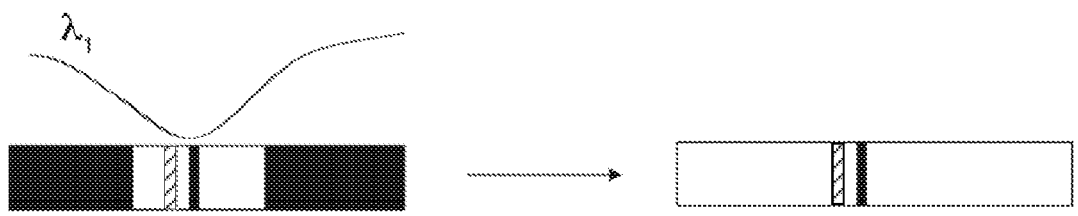
FIG. 2D
FIG. 2E
FIG. 2F
FIG. 2G
FIG. 2H

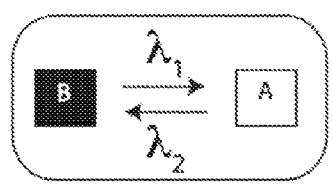
FIG. 4A
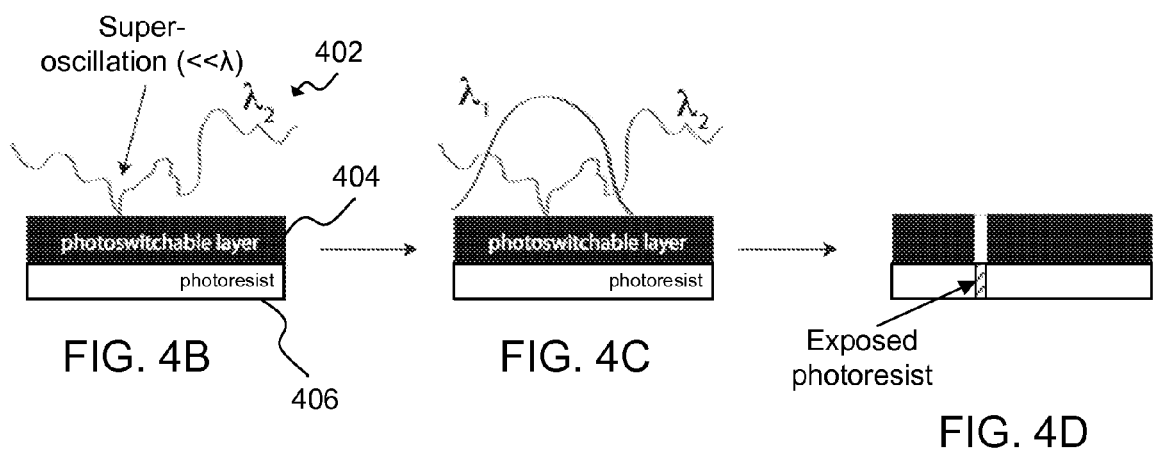
FIG. 4B
FIG. 4C
FIG. 4D

Dense fluorophores in a sample

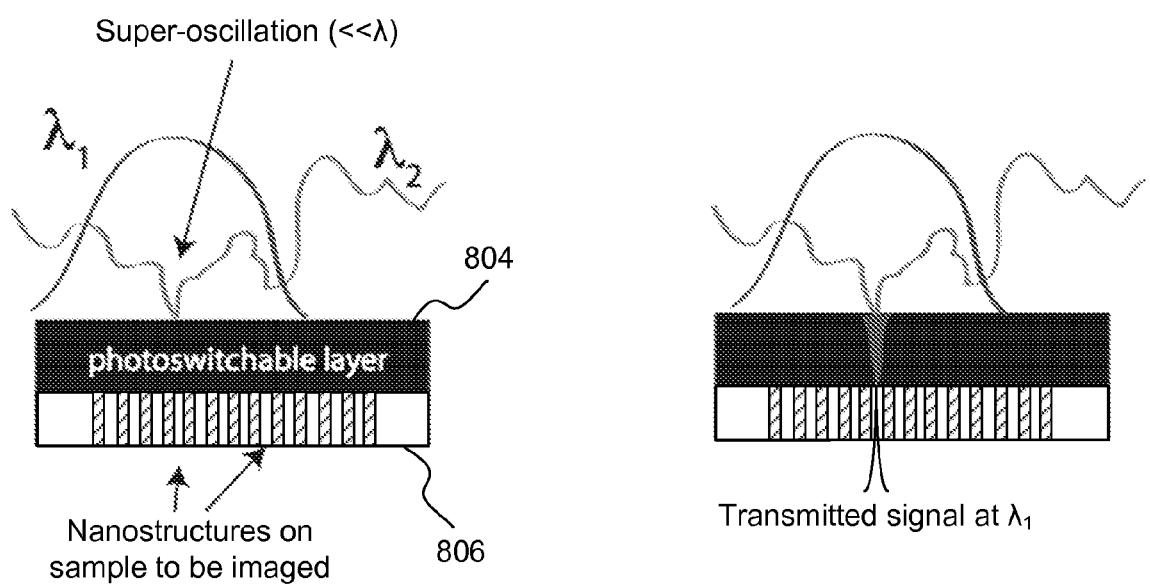

Multi-level pattern in an absorber (e.g., metal)

Multi-level pattern in an absorber (e.g., metal) overfilled with a transparent dielectric Different multi-level pattern in transparent material (e.g., dielectric)

Multi-level pattern etched into an absorber (e.g., metal)

SUB-DIFFRACTION-LIMITED PATTERNING AND IMAGING

RELATED APPLICATIONS

This application claims the benefit of and hereby incorporates by reference U.S. Provisional Patent Application Ser. No. 62/064,800, filed Oct. 16, 2014.

FIELD OF THE INVENTION

The present invention relates generally to creating and imaging nanoscale patterns using a super-oscillating portion of an optical field, thereby achieving a pattern resolution that is beyond a far-field diffraction limit.

BACKGROUND

An optical imaging system (e.g., a microscope or optical imaging device) can use wavelengths of light to create an image of a sample. For example, the optical imaging system can utilize visible, ultraviolet, or infrared light to perform imaging of the sample. As a non-limiting example, optical imaging systems can be used to obtain detailed images of tissues, cells and/or molecules of a human subject. These detailed images can be used by scientists for research and/or medical practitioners for disease diagnosis and treatment.

Optical imaging and patterning can be limited by a far-field diffraction limit. The far-field diffraction limit can limit imaging patterns or creating patterns that are spaced by a distance closer than approximately $\lambda/2$, where $\lambda$, is a wavelength of an illumination. In far-field diffraction, a diffraction pattern can be viewed at a long distance from the diffracting object, or the diffraction pattern can be viewed at the focal plane of an imaging lens.

SUMMARY

A method for sub-diffraction-limited patterning using a photoswitchable layer can include selectively exposing a sample of the photoswitchable layer to a first wavelength of illumination that includes a super-oscillatory peak. A region in the sample that corresponds to the super-oscillatory peak is converted from a first transition state to a second transition state. Selected regions in the sample that do not correspond to the super-oscillatory peak are converted from the first transition state to the second transition state. The method also includes selectively exposing the sample to a second wavelength of illumination that does not include the super-oscillatory peak. The selected regions in the sample are converted back to the first transition state and the region in the sample that corresponds to the super-oscillatory peak remains in the second transition state. The method optionally further includes converting the region in the sample that corresponds to the super-oscillatory peak into a third transition state. The region in the sample at the third transition state constitutes a pattern of an isolated feature with a size that is substantially smaller than a far-field diffraction limit.

In one example, the sample can be displaced in accordance with a defined displacement level. The sample can be selectively exposed with the first wavelength of illumination and the second wavelength of illumination in order to obtain a second regions in the sample at the third transition state. The sample is repeatedly displaced by the defined displacement level and selectively exposed to the first wavelength and the second wavelength in order to create a plurality of regions in the third transition state that represent a dense set of features in the pattern. A spacing between each of the features in the sample corresponds to the defined displacement level and is substantially less than the far-field diffraction limit.

In one aspect, selectively exposing the sample to the first wavelength includes exposing the sample to the first wavelength of illumination for a first defined period and a first defined intensity level, and selectively exposing the sample to a second wavelength includes exposing the sample to the second wavelength of illumination according to a second defined period and a second defined intensity level.

In one aspect, converting the region in the sample is accomplished by at least one of: dissolving the region, electrochemically oxidizing the region and chemically modifying the region.

In yet another alternative, the method can further include placing the photoswitchable layer on top of a photoresist layer in order to create the sample. A plurality of exposures can be performed on the sample with the first wavelength of illumination and the second wavelength of illumination in order to obtain a plurality of exposed regions in the photoresist layer that correspond to the third transition state. The photoswitchable layer can be removed in order to reveal the photoresist layer with the plurality of exposed regions that that correspond to the third transition state. The exposed regions represent a dense set of features in the pattern. A spacing between each of the features in the sample corresponds to a defined displacement level and are substantially less than the far-field diffraction limit.

In one example, the sample is simultaneously exposed to the first wavelength of illumination and the second wavelength of illumination. Alternatively, the sample is exposed to the first wavelength of illumination earlier in time as compared to the second wavelength of illumination.

The method for sub-diffraction-limited patterning can be performed in two dimensions or three dimensions as described in more detail below.

In another example, the method can further include generating a super-oscillating optical field that includes the super-oscillatory peak using an attenuating phase-shifting optical element.

In one configuration, the method can further include generating the first wavelength of illumination and the second wavelength of illumination using a spatial-light modulator (SLM).

A method for sub-diffraction-limited imaging can include selectively exposing a sample containing a distribution of fluorophores to a first wavelength of illumination that does not include a super-oscillating node, and selectively exposing the sample containing the distribution of fluorophores to a second wavelength of illumination that includes the super-oscillating node. The method can also include scanning the sample with respect to the first wavelength of illumination and the second wavelength of illumination in order to create a sub-diffraction-limited image.

In one example, the method can further include collecting fluorescent photons from a fluorophore that corresponds to a location of the super-oscillating node. Remaining fluorophores in the sample are quenched after exposure to the second wavelength of illumination that includes the super-oscillating node.

In another example, the method can further include determining position information for the fluorophore that emits the fluorescent photons based on a known location associated with the super-oscillating node.

In one aspect, the sample is selectively exposed to the first wavelength of illumination based on a diffraction-limited focal spot that is used to excite the fluorophores in the sample.

In another aspect, a plurality of super-oscillating nodes are used to perform the sub-diffraction-limited imaging.

In yet another aspect, a resolution below 10 nanometers (nm) with visible light is obtained when performing the sub-diffraction-limited imaging using super-oscillations.

An imaging system operable to perform sub-diffraction-limited patterning can include a spatial light modulator (SLM) configured to produce at least two illuminations of light. The illuminations of light include a first wavelength of illumination and a second wavelength of illumination. The imaging system can include a super-oscillating lens configured to generate a defined super-oscillating function for the second wavelength of illumination. The second wavelength of illumination includes a super-oscillatory peak and the first wavelength of illumination does not include the super-oscillatory peak. The imaging system includes a sample that is selectively exposed to the first wavelength of illumination and the second wavelength of illumination such that a pattern from the sample is imaged with a size that is substantially smaller than a far-field diffraction limit.

In one configuration, the imaging system includes a scanning stage on which the sample is mounted on in order to enable dense patterning of features with respect to the sample.

In one aspect, the sample includes a photoswitchable layer, or the sample includes a photoswitchable layer that is positioned on top of a photoresist layer.

In one aspect, the sample is simultaneously exposed to the first wavelength of illumination and the second wavelength of illumination; or the sample is exposed to the first wavelength of illumination earlier in time as compared to the second wavelength of illumination.

In another aspect, the sample is selectively exposed to the first wavelength of illumination in accordance with a first defined period and a first defined intensity level; and the sample is selectively exposed to the second wavelength of illumination in accordance with a second defined period and a second defined intensity level.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIGS. 1A-1G illustrate a technique for optical nanopatterning using a super-oscillating peak in accordance with an embodiment of the present invention;

FIGS. 2A-2H illustrate a technique for optical nanopatterning of closely spaced features using a super-oscillating peak in accordance with an embodiment of the present invention;

FIGS. 4A-4D illustrate an alternative technique for optical nanopatterning of closely spaced features using a super-oscillating node in conjunction with a photoswitchable layer in proximity to a photoresist in accordance with an embodiment of the present invention;

FIGS. 8A-8B illustrate a technique for nanoscale imaging using a photoswitchable layer and a super-oscillating node in accordance with an embodiment of the present invention;

Figure 3A:
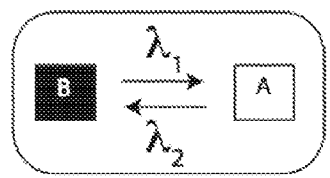
FIGS. 3A-3I illustrate a technique for optical nanopatterning of closely spaced features using a super-oscillating node in conjunction with a photoswitchable layer in proximity to a photoresist in accordance with an embodiment of the present invention.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

In describing and claiming the present invention, the following terminology will be used.

The singular forms "a," "an," and "the" include plural referents unless the context clearly dictates otherwise. Thus, for example, reference to "a particle" includes reference to one or more of such materials and reference to "exposing" refers to one or more such steps.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of" For example, "at least one of A, B and C" explicitly includes only A, only B, only C, or combinations of each.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

A technology (e.g., optical imaging device, methods, processes, computer circuitry, and systems) is described herein for creating and imaging nanoscale patterns using long-wavelength photons. In one example, a resolution for the nanoscale patterns can be achieved that is beyond a far-field diffraction limit by using super-oscillating portions of an optical field. The super-oscillating portions of the optical field can be generated using single or arrays of diffractive lenses. Optical nanopatterning can be achieved by using photoswitchable materials that are toggled in a repeatable and robust fashion between two distinct states. The photoswitchable materials can be toggled by exposure to two distinct wavelengths of light (or other external stimuli). While stepping or scanning a sample (e.g. substrate with photoswitchable materials) in between exposures, illumination patterns can be designed that "erase" previous exposures, thereby creating patterns that are substantially smaller than a diffraction limit. Such patterns can be "fixed" for patterning or imaged for microscopy as described herein.

Diffraction refers to various phenomena which occur when a wave encounters an obstacle. The diffraction phenomenon can be described as the apparent bending of waves around small obstacles and the spreading out of waves past small openings. Diffractive effects can occur when a light wave travels through a medium with a varying refractive index (e.g., air or a transparent substrate). Diffraction can occur with all types of waves, including sound waves and electromagnetic waves, such as visible light, infrared, X-rays, and radio waves.

The resolution of an optical imaging system (e.g., a microscope or optical imaging device) can be limited by various factors, such as imperfections in the lenses, misalignment, or an instrument's theoretical diffraction limit. The diffraction limit can limit the resolution of the optical system due to diffraction. The resolution of a given instrument can be proportional to the size of the instrument's objective, and inversely proportional to the wavelength of the light being observed. Far-field imaging can be used to create images of objects that are large compared to the illumination wavelength where the objects contain fine structure. Far-field imaging can include biological applications in which cells span multiple wavelengths but contain structures down to the molecular scale. Far-field imaging can also be used in photolithography (or optical lithography) used to fabricate electrical or electrical-mechanical structures (e.g., for computer circuitry). A far-field diffraction limit can be limited by the wavelength ($\lambda$) of the light or electromagnetic wave used to generate the image.

When the distance between an aperture of the imaging device and a plane in which the pattern is observed is large enough (e.g., the difference in phase between the light from the extremes of the aperture is much less than the wavelength of the light), then individual contributions of light can be treated as though the light waves are parallel. Far field can refer to the relatively large distance between the aperture and the plane in which the pattern is observed and can be defined as being located at a distance which is significantly greater than $W2/\lambda$, where $\lambda$ is the wavelength and W is the largest dimension in the aperture.

The technology described herein can simplify the process of sub-diffraction-limited patterning by using photoswitchable recording materials. More specifically, the technology described herein can overcome the far-field diffraction limit using fluorescence switching for microscopy and photoswitchable molecules for lithography.

Nanopatterning

In one configuration, super-oscillating optical fields can be used for achieving nanoscale pattern resolutions that overcome the far-field diffraction limit. A super-oscillation is a mathematical construct that allows band-limited functions to oscillate at frequencies that exceed a Nyquist limit. In other words, super-oscillation is a phenomenon in which a signal which is globally band-limited can contain local segments that oscillate faster than its fastest Fourier components. More specifically, finite-energy signals that are band limited to a fixed and arbitrarily small frequency can be constructed, wherein the finite-energy signals can interpolate samples of a sinusoid or a square wave or any other waveform of arbitrarily high frequency. Although super-oscillations can have relatively high spatial frequencies, the amplitudes for the super-oscillations are typically relatively small. The energy within the super-oscillations can be relatively small compared to a total energy in the function. In optical fields, the energy within the super-oscillations can translate into relatively high side-lobes and relatively large background noise. While directly using such optical fields for nanopatterning can be challenging, the novel solution described herein provides an improved diffractive lens design and reduces background noise in resulting images with respect to nanopatterning.

FIGS. 1A-1G illustrate an exemplary technique for optical nanopatterning using a super-oscillating peak (or local maxima). More specifically, FIGS. 1A-1G illustrate a scheme of reactions and corresponding sequence of steps that provides for sub-diffraction limited patterning.

FIG. 1A illustrates a recording material that is comprised of a photoswitchable material. The photoswitchable material can be switched between two states: A and B. When the material is in the A state and is exposed to a $\lambda_2$ illumination, the material turns into the B state. When the material is in the B state and is exposed to a $\lambda_1$ illumination, the material turns into the A state. Some types of photoswitchable materials also utilize an activator in conjunction with the photoswitchable material to allow rapid photoswitching. Although a wide variety of photoswitchable materials can be used several non-limiting examples include photochromic molecules such as diarylethenes, spiro-oxazines, fulgides, azobenzenes, spiropyrans, azo dyes, cyanine dyes, bithienylethene (BTE), 1,2-bis(5,5'-dimethyl-2,2'-bithiophen-yl) perfluorocyclopent-1-ene, ruthenium tris(bipyridine) dichloride ($Ru(bpy)_3Cl_2$), polyamides, and the like, solid-state materials such as photoactive metal oxides, saturable absorbers, laser-dye molecules, composites thereof, mixtures thereof, and the like. Other thermally-stable photochromic system or molecules containing electroactive moieties can certainly qualify for use in the technology described herein. Generally, a photoswitchable material can be used which is selectively responsive to at least two different wavelengths (i.e. $\lambda_1$ and $\lambda_2$).

Conversion wavelengths can generally be in the ultraviolet, visible, or near infrared ranges, although other wavelengths may be useful. Conversions wavelengths can be widely separated or close together as long as the photoswitchable material is selectively responsive to $\lambda_1$ and $\lambda_2$. In one aspect, the conversion wavelengths can be separated by at least 50 nm, and in some cases at least 200 nm. One example of conversion wavelengths can be about 325 nm for $\lambda_1$ and about 633 nm for $\lambda_2$. In a one-material mixture system, a molecule can be converted into an irreversible state or irreversible transformation using an illumination with $\lambda_3$, which differs from $\lambda_1$ and $\lambda_2$. Alternatively, the molecule can be converted into an irreversible state or irreversible transformation using a catalyst or other chemical reaction.

In FIG. 1B, a sample 102 with a layer of the material (originally in state A) is first exposed to an optical field at wavelength $\lambda_2$, which contains a super-oscillatory peak. The super-oscillation can be much less than wavelength $\lambda_2$.

As shown in FIG. 1C, in the sample 102, a portion of the material that corresponds to the super-oscillatory peak can be converted from state A to state B, as long as the exposure dose (of the $\lambda_2$ illumination) is higher than a threshold value. By choosing an appropriate intensity of light and exposure time, a pattern of exposure can be created in which there is a region of state B with a size that is comparable to a size of the super-oscillation (and smaller than a far-field diffraction barrier). In addition, in the sample 102, there is a region that remains in state A, whose size is larger than the diffraction barrier, and this region of state A can surround the region of state B (with the size that is comparable to the size of the super-oscillation).

FIG. 1D illustrates the sample 102 being exposed to a conventional illumination (with no super-oscillations) at wavelength $\lambda_1$. In other words, the sample 102 can include a region of state A that surrounds a region of state B (as shown in FIG. 1C), and the sample 102 can be exposed to the conventional illumination at wavelength $\lambda_1$.

In an example, wavelength $\lambda_1$ can represent a range of wavelengths in a first bandwidth, and wavelength $\lambda_2$ can represent a range of wavelengths in a second bandwidth, where the first bandwidth does not include wavelengths in the second bandwidth, and the second bandwidth does not include wavelengths in the first bandwidth.

As shown in FIG. 1E, a region may thus be created that is centered on the previous super-oscillation. The region in FIG. 1E can be diffraction limited as indicated by its relatively larger size as compared to the size of the super-oscillation in FIG. 1B. In addition, regions of the material that receive an exposure dose of wavelength $\lambda_1$ beyond a certain threshold can be converted from state B to state A. The intensity of the illumination and the exposure time can be controlled to ensure that the material is converted to state A, except a relatively small region of state B. This relatively small region of state B is still smaller than the far-field diffraction limit.

This relatively small region of state B (shown in FIG. 1F) can be converted irreversibly ("locked") into a third state C, as shown in FIG. 1G. This locking step does not affect the region of state A in the sample 102. The locking can be achieved via selectively dissolving away the region of state B, selectively electrochemically oxidizing the region of state B, or selectively chemically modifying the region of state B into the third state (e.g., state C).

In some examples, the "locking" step or developing of a photoresist can be achieved using various mechanisms including using a photochemical reaction, electrochemical oxidation, chemical oxidation, or dissolving the material away or other techniques. As shown in FIG. 1G, an isolated feature has been patterned with a size that is relatively smaller than the far-field diffraction limit.

Alternatively, in another example, a sample 102 (e.g., resist material) in state A can be converted irreversibly to state C, depending on the properties of the resist material. In other words, in the sample 102, rather than a region in state B being converted irreversibly to state C, the region in state A can be converted irreversibly to state C.

FIGS. 2A-2H illustrate an exemplary technique for optical nanopatterning of closely spaced features using a super-oscillating peak. The technique described in FIGS. 2A-2H can be used to create dense features, e.g., features with spacing that is relatively smaller than the diffraction limit.

FIG. 2A illustrates a recording material that is comprised of a photoswitchable material. This material can be switched between two states: A and B. When the material is in state A and is exposed to a $\lambda_2$ illumination, the material turns into state B. When the material is in state B and is exposed to a $\lambda_1$ illumination, the material turns into state A.

In FIG. 2B, a sample 202 can be exposed to a $\lambda_2$ illumination (or beam) with the super-oscillation. The sample 202 can be similar to the sample in FIG. 1G. In other words, the sample 202 with a relatively small region that is converted irreversibly into state C (and the remaining regions of the sample 202 are in state A) can be exposed to the $\lambda_2$ illumination. The sample 202 can be displaced or shifted relative to the beam, as illustrated in FIG. 2B. For example, the sample 202 can be slightly shifted to the left. This displacement can now determine a closest spacing between the features. In other words, a level of displacement can be used to define the spacing between the features of the sample 202.

As shown in FIG. 2C, in the sample 202, a portion of the material that corresponds to the super-oscillatory peak can be converted from state A to state B, as long as the exposure dose (of the $\lambda_2$ illumination) is higher than a threshold value. By choosing an appropriate intensity of light and exposure time, a pattern of exposure can be created in which there is a region of B with a size that is comparable to a size of the super-oscillation (and smaller than a far-field diffraction barrier). The region of state B can be adjacent to the region of state C, wherein state B and state C can be spaced in accordance with the level of displacement of the sample 202. In addition, in the sample 202, there is a region that remains in state A, whose size is larger than the diffraction barrier, and this region of state A can surround the regions of state B and state C (with the size that is comparable to the size of the super-oscillation).

FIG. 2D illustrates the sample 202 being exposed to a conventional illumination (with no super-oscillations) at wavelength $\lambda_1$. In other words, the sample 202 that includes a region of state A that surrounds the regions of state B and state C (as shown in FIG. 2C) can be exposed to the conventional illumination at wavelength $\lambda_1$.

As shown in FIG. 2E, an intensity of the illumination and the exposure time can be controlled to ensure that the material is converted to state A, except a relatively small region of state C and a relatively small region of state B. In other words, regions of the material that receive an exposure dose of wavelength $\lambda_1$ beyond a certain threshold can be converted from state B to state A. The region of state B can be diffraction limited as indicated by its relatively larger size as compared to the size of the super-oscillation in FIG. 2B. The relatively small region of state C and the relatively small region of state B are still smaller than the far-field diffraction limit.

The relatively small regions of state C and state B (shown in FIG. 2F) can be converted irreversibly ("locked") into two states of C, as shown in FIG. 2G. This locking step does not affect the region of state A in the sample 202. The locking can be achieved via selectively dissolving away the region of state B, selectively electrochemically oxidizing the region of state B, or selectively chemically modifying the region of state B into the third state (e.g., state C). As a result, the sample 202 can have two regions of state C. In addition, the two regions of state C (or two features) cam ne spaced relatively close to each other. The spacing between them can be smaller than the far-field diffraction limit. In theory, this spacing is unlimited by diffraction, since the super-oscillations can be arbitrarily fast.

FIG. 2H illustrates a sample 202 with a dense set of features. The dense set of features can be achieved when the steps described in FIGS. 2B-2G are repeated. In other words, a region of the sample 202 (in state A) can again be displaced by a certain amount and exposed to a $\lambda_2$ illumination (or beam) with the super-oscillation, thereby causing the region to change from state A to state B. The region of state B can be to a conventional illumination (with no super-oscillations) at wavelength $\lambda_1$, and then the region of state B can be locked into state C. By repeating this process, the sample 202 can include the dense set of features as illustrated. In this manner, any number of dense features can be formed.

In one example, the nanopatterning techniques described with respect to FIGS. 1A-1G and 2A-2H can be applied to both two dimensions and three dimensions. In other words, super-oscillations can be generated in two dimensions, as well as three dimensions. A node in the $\lambda_1$ beam can also be generated in two dimensions or three dimensions. Although dense grating-like patterns are shown here, arbitrary geometries can be created by varying the displacements between exposures and/or using a dot-matrix approach to pattern generation.

FIGS. 3A-3I illustrate an exemplary technique for optical nanopatterning of closely spaced features using a super-oscillating node in conjunction with a photoswitchable layer in proximity to a photoresist. This technique is based on absorbance modulation.

FIG. 3A illustrates a recording material that is comprised of a photoswitchable material. The photoswitchable material can be similar to that described in FIGS. 1A and 2A. The photoswitchable material can be switched between two states: A and B. When the photoswitchable material is in the A state and is exposed to a $\lambda_2$ illumination, the material turns into the B state. When the photoswitchable material is in the B state and is exposed to a $\lambda_1$ illumination, the material turns into the A state.

Figures 3B, 3C, 3D:
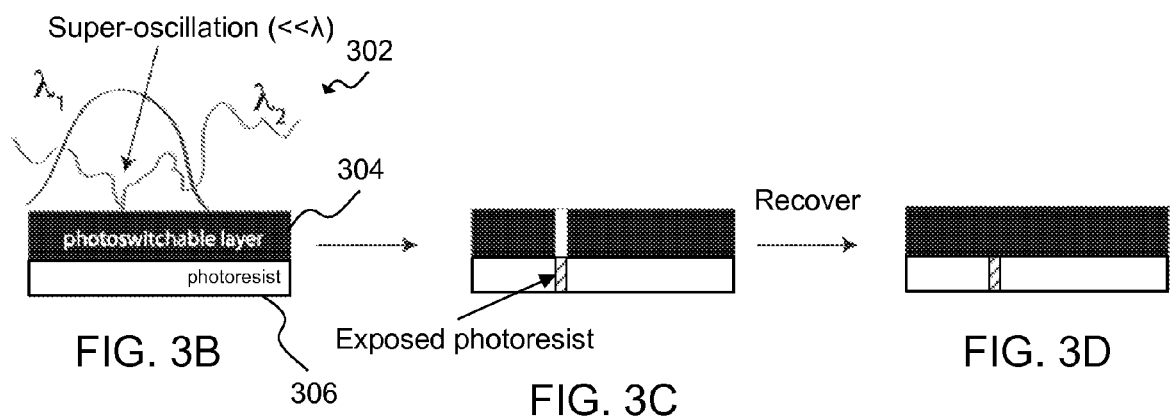

FIG. 3B illustrates a sample 302 with the photoswitchable material (or layer) 304 placed on top of a photoresist layer 306. The photoswitchable layer 304 can initially be in the B state. The sample 302 can be illuminated to two wavelengths simultaneously. More specifically, the sample 302 can be illuminated at wavelength $\lambda_2$ (which has a super-oscillating node), while simultaneously being illuminated at wavelength $\lambda_1$ (which is a conventional illumination with diffraction-limited region, i.e., no super-oscillations).

As shown in FIG. 3C, by choosing defined intensities and exposure times at the two wavelengths (e.g., $\lambda_1$ and $\lambda_2$), a deep sub-wavelength region in state A can be created. If state A is transparent to $\lambda_1$ and state B is opaque to $\lambda_1$, then this two-wavelength illumination can result in a narrow region of exposed photoresist (in state C).

As shown in FIG. 3D, the photoswitchable layer 304 is allowed to recover to the original state B, e.g., through exposure to a uniform illumination at $\lambda_2$, exposure to a different wavelength, thermally or spontaneous relaxation, or by other means. In this manner, the photoswitchable layer can act as a reusable or reconfigurable mask.

Figures 3E, 3F, 3G:
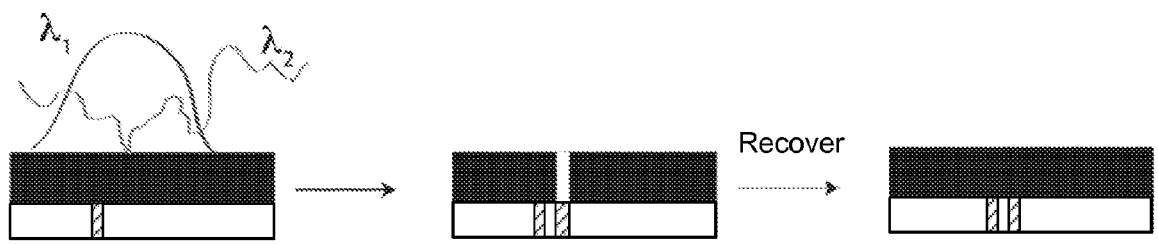

As shown in FIG. 3E, the sample 302 can be displaced or shifted relative to the two beams. For example, the sample 302 can be slightly shifted to the left. This displacement can now determine a closest spacing between the features. In other words, a level of displacement can be used to define the spacing between the features of the sample 302. The relative displacement can determine spacing between the nearest features, and the relative displacement can be smaller than the far-field diffraction limit.

After the sample 302 is displaced relative to the two beams, the exposure can be repeated. Therefore, the sample 302 can be illuminated to the two wavelengths simultaneously. More specifically, the sample 302 can be illuminated at wavelength $\lambda_2$ (which has a super-oscillating node), while simultaneously being illuminated at wavelength $\lambda_1$ (which is a conventional illumination with diffraction-limited region, i.e., no super-oscillations).

As shown in FIG. 3F, by choosing defined intensities and exposure times at the two wavelengths (e.g., $\lambda_1$ and $\lambda_2$), a deep sub-wavelength region in state A can be created. If state A is transparent to $\lambda_1$ and state B is opaque to $\lambda_1$, then this two-wavelength illumination can result in a narrow region of exposed photoresist (in state C). At this point, since the process has been repeated, the photoresist layer 306 can include two narrow regions of exposed photoresist (in state C). In other words, two closely-spaced exposed regions can occur in the photoresist layer 306.

As shown in FIG. 3G, the photoswitchable layer is allowed to recover to the original state B, e.g., through exposure to a uniform illumination at $\lambda_2$, exposure to a different wavelength, thermally or spontaneous relaxation, or by other means.

Figures 3H, 3I:
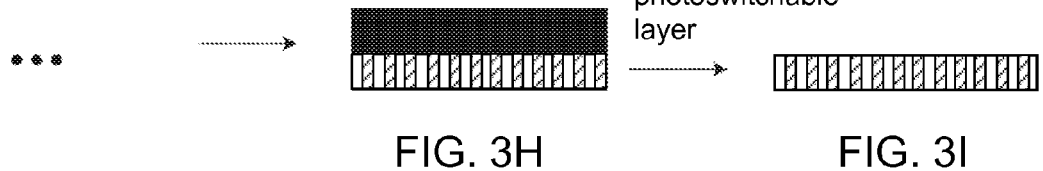

FIG. 3H illustrates a sample 302 with a dense set of features in the photoresist layer 306. The dense set of features in the photoresist layer 306 can be achieved when the steps described in FIGS. 3B-3G are repeated.

As shown in FIG. 3I, after the exposures are completed to create the dense set of features in the photoresist layer 306, the photoswitchable layer 304 can be removed and the photoresist layer 306 can be processed in a conventional manner. In FIG. 3I, although dense features are shown, arbitrary geometries can be created by either varying the displacement between exposures and/or using a dot-matrix approach to pattern generation. In addition, the approach described in FIGS. 3A-3I can be extended to two dimensions.

FIGS. 4A-4D illustrate an alternative technique for optical nanopatterning of closely spaced features using a super-oscillating node in conjunction with a photoswitchable layer in proximity to a photoresist. In this alternative technique, wavelength illuminations of a sample 402 can be controlled independently.

FIG. 4A illustrates a recording material that is comprised of a photoswitchable material. This material can be switched between two states: A and B. When the photoswitchable material is in the A state and is exposed to a $\lambda_2$ illumination, the material turns into the B state. When the photoswitchable material is in the B state and is exposed to a $\lambda_1$ illumination, the material turns into the A state.

As shown in FIG. 4B, a sample 402 with the photoswitchable material (or layer) 404 can be placed on top of a photoresist layer 406. The photoswitchable layer 404 can initially be in the B state. The sample 402 can be illuminated only at wavelength $\lambda_2$ (which has a super-oscillating node). In other words, in some cases, it can be desirable to control an exposure time at $\lambda_2$ independently from that at $\lambda_1$. Therefore, an exposure time can be controlled independently by first exposing the sample 402 to only a super-oscillating node at $\lambda_2$ (i.e., without $\lambda_1$).

As shown in FIG. 4C, the sample 402 can be illuminated at wavelength $\lambda_2$ (which has a super-oscillating node), while simultaneously being illuminated at wavelength $\lambda_1$ (which is a conventional illumination with diffraction-limited region, i.e., no super-oscillations). In other words, the $\lambda_1$ beam can be turned on after a short delay, thereby resulting in an exposure with both of the wavelengths. By choosing defined intensities and exposure times at the two wavelengths (e.g., $\lambda_1$ and $\lambda_2$), a deep sub-wavelength region in state A can be created, as indicated in FIG. 4D. If state A is transparent to $\lambda_1$ and state B is opaque to $\lambda_1$, then this two-wavelength illumination can result in a narrow region of exposed photoresist (in state C).

The photoswitchable layer 404 can be allowed to recover to the original state B, e.g., through exposure to a uniform illumination at $\lambda_2$, exposure to a different wavelength, thermally or spontaneous relaxation, or by other means. The sample 402 can be displaced relative to the two beams and the exposure is repeated. The relative displacement can be smaller than the far-field diffraction limit. The relative displacement can determine spacing between the nearest features. Two closely-spaced exposed regions can occur in the photoresist layer 406. If these steps are repeated, a dense set of features can be created. After the exposures are completed, the photoswitchable layer 404 can be removed and the photoresist layer 406 can be processed in a conventional manner.

Nanoscale Imaging

In one configuration, the super-oscillations as described earlier can be used for nanoscale imaging. The energy in the super-oscillations can be small compared to the background noise, thereby resulting in a relatively large amount of noise in the images and difficulty in achieving high resolution. In previous solutions, the size of the super-oscillation had to be compromised (e.g., substantially increased) in order to avoid the relatively high background noise. In the novel techniques described herein, nanoscale imaging can be performed even in the presence of relatively high background noise. As a result, the super-oscillations can be relatively small and resolutions below 10 nanometers (nm) can be achieved with visible light. Four different approaches to nanoscale imaging are described below (in FIGS. 5-8).

FIGS. 5A-5D illustrate an exemplary technique for nanoscale imaging using a super-oscillating node. The technique described in FIGS. 5A-5D is an augmentation of stimulated-depletion-emission (STED) microscopy through an application of super-oscillations.

Figure 5A:
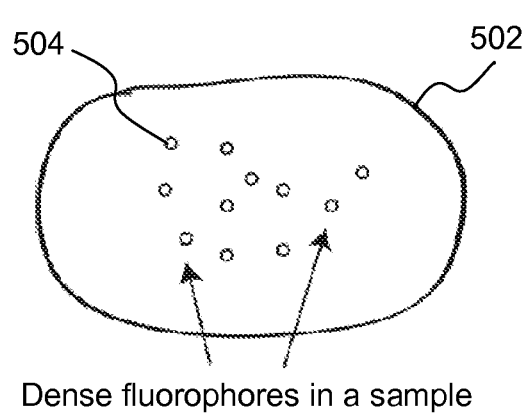
FIGS. 5A-5D illustrate a technique for nanoscale imaging using a super-oscillating node in accordance with an embodiment of the present invention.

FIG. 5A illustrates a sample 502 that comprises a dense distribution of fluorophores 504. A fluorophore 504 is a fluorescent chemical compound that can re-emit light upon light excitation. These may include markers in living cells, fluorescent proteins, etc. Fluorophores 504 can be used as a tracer in fluids, as a dye for staining of certain structures, as a substrate of enzymes, or as a probe or indicator when its fluorescence is affected by environment, such as polarity, ions, etc. Fluorophores 504 can serve as a marker (or dye, or tag, or reporter) for affine or bioactive reagents (e.g., antibodies, peptides, nucleic acids). In addition, fluorophores 504 can be used to stain tissues, cells, or materials in a variety of analytical methods, i.e., fluorescent imaging and spectroscopy.

Figure 5B:
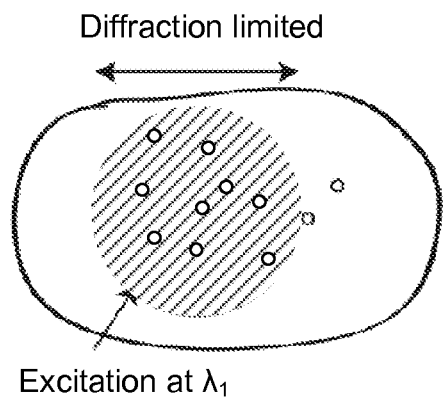

As shown in FIG. 5B, a normal diffraction-limited focal spot can be used to excite a plurality of fluorophores 504. In other words, an excitation spot can occur at a wavelength $\lambda_1$, and the excitation at wavelength $\lambda_1$ can excite a dense distribution of fluorophores 504 in the sample 502.

Figure 5C:
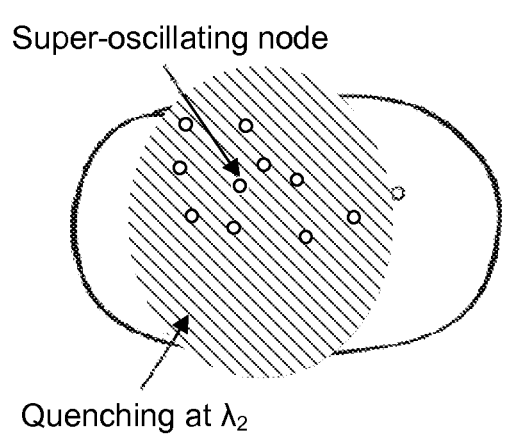

As shown in FIG. 5C, a focused beam at a different wavelength, $\lambda_2$, that contains a super-oscillating node can be subsequently placed in the same location as the excitation spot. In other words, the wavelength $\lambda_2$ can quench (i.e., not fluoresce) the dense distribution of fluorophores 504 in the sample 502.

Figure 5D:
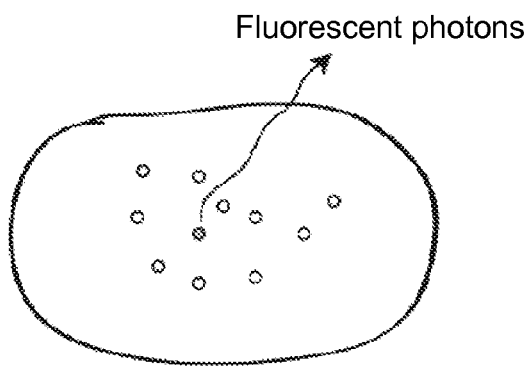

As shown in FIG. 5D, the fluorophores 504 (except the one fluorophore at the super-oscillating node) are now quenched, i.e., will not fluoresce. Therefore, fluorescent photons can be collected only from that one fluorophore 504.

If the photons are counted, it may be possible to localize the position of the emitting fluorophore 504. Furthermore, the location of the super-oscillating node can be previously known, which provides additional position information of the emitting fluorophore 504. By scanning the sample 502 relative to the two beams and collecting the signal, a sub-diffraction-limited image (i.e., an image that is not limited by a far-field diffraction limit) can be created. In one example, the technique described in FIGS. 5A-5D can be implemented over a relatively larger field of view if an array of super-oscillating nodes is used, wherein each node can be spaced by a distance larger than the diffraction limit of the signal-detection optics, thereby allowing for imaging at an increased speed.

Figures 6A, 6B:
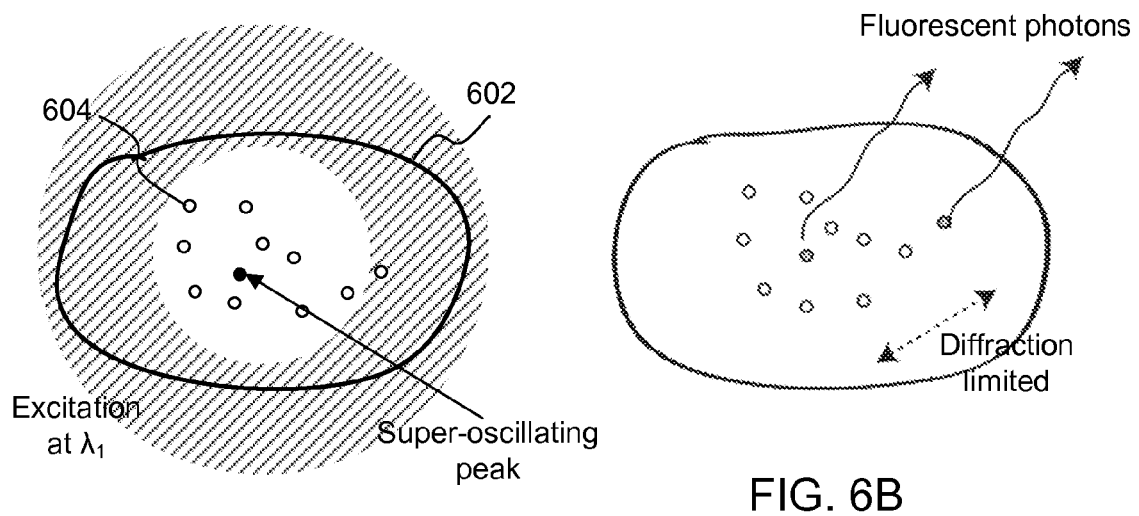
FIGS. 6A-6B illustrate a technique for nanoscale imaging using a super-oscillating peak in accordance with an embodiment of the present invention.

FIGS. 6A-6B illustrate an exemplary technique for nanoscale imaging using a super-oscillating peak. A sample 602 (as illustrated in FIGS. 5A-5D) can be illuminated by a focused beam that contains at least one super-oscillating peak. The super-oscillating peak can be fairly isolated (greater than the diffraction limit) from the rest of the beam as shown. A single fluorophore 604 in proximity to the super-oscillating peak can be excited, as shown in FIG. 6A. In addition, other fluorophores 604 can be excited as well, but these fluorophores 604 can be spaced from the central fluorophore 604 (i.e., the fluorophore 604 in proximity to the super-oscillating peak) by a distance larger than the diffraction limit of the signal-detection optical system. Therefore, the various fluorophores 604 can be easily distinguished from one another. In one example, the location of the super-oscillating peak can be previously known.

As shown in FIG. 6B, fluorescent photons can be collected from the central fluorophore 604. By counting the photons from the central fluorophore 604, the position of the central fluorophore 604 can be localized. The sample 602 can be scanned relative to the beam and a signal can be collected for each excitation frame. The signals can be combined to create a sub-diffraction limited image.

In one configuration, the technique described in FIGS. 6A-6B can use a single wavelength. In addition, the technique can be implemented, for example, in a conventional confocal microscope. In another example, the technique can be implemented with multiple super-oscillating peaks in order to increase imaging speed. When multiple super-oscillating peaks are used, the super-oscillating peaks can be spaced by a distance farther than the diffraction limit of the signal-detection optics.

FIGS. 7A-7D illustrate an exemplary technique for nanoscale imaging using a super-oscillating peak for fluorophore activation. The technique described in FIGS. 7A-7D is an augmentation of photo-activation-localization microscopy (PALM). The fluorophores 704 can be activated by exposure to one wavelength (e.g., $\lambda_2$). If the fluorophores 704 are not activated, then the fluorophores 704 do not emit fluorescent photons when excited by $\lambda_1$. In some cases, $\lambda_1$ and $\lambda_2$ can be the same. The activation can occur at a relatively lower intensity.

Figure 7A:
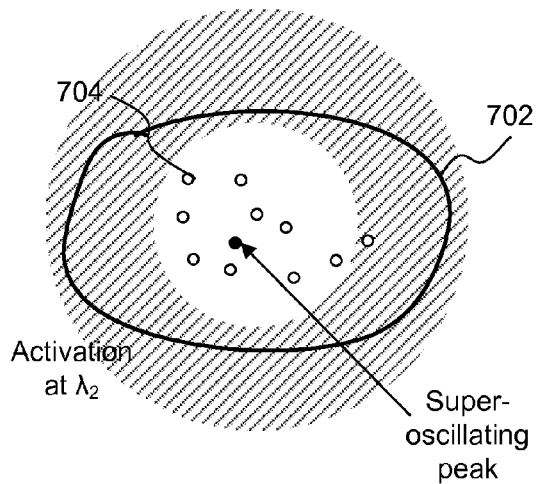
FIGS. 7A-7D illustrate a technique for nanoscale imaging using a super-oscillating peak for fluorophore activation in accordance with an embodiment of the present invention.

As shown in FIG. 7A, a sample 702 can be activated by a focused beam at $\lambda_2$, which contains a super-oscillating peak. More specifically, a single fluorophore 704 in proximity to the super-oscillating peak can be activated.

Figure 7B:
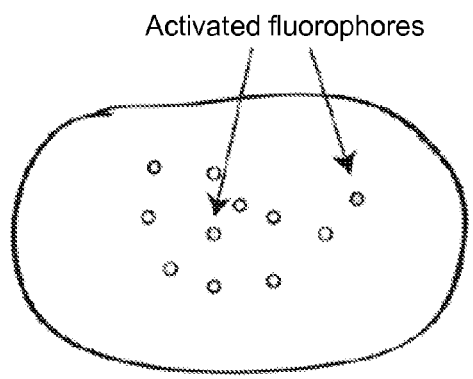

As shown in FIG. 7B, other fluorophores 704 in the sample 702 can be activated as well. These other fluorophores 704 can be spaced from the central fluorophore 704 (near the super-oscillating peak) by a distance larger than the diffraction limit of the signal-detection optics.

Figure 7C:
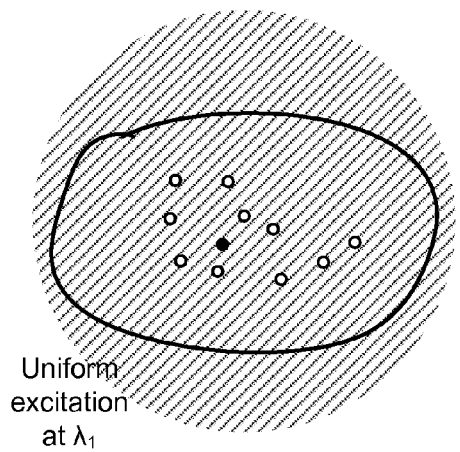

As shown in FIG. 7C, the sample 702 can be excited by a uniform illumination (or a focused beam) at $\lambda_1$. In other words, the sample 702 in which the single fluorophore 704 in proximity to the super-oscillating peak is activated, as well as the other fluorophores 704 in the sample 702, can be uniformly illuminated by wavelength $\lambda_1$.

Figure 7D:
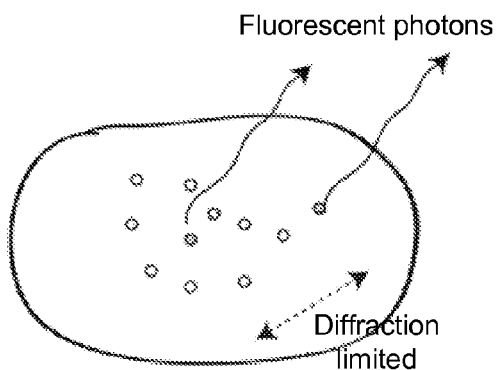

As shown in FIG. 7D, activated fluorophores 704 can emit photons. By using standard localization algorithms, the central fluorophore 704 can be localized by knowledge of the location of the super-oscillating peak and by counting the number of photons emitted, and using standard localization algorithms. The sample 702 can be scanned relative to the beams and the image can be created similar to previously described techniques above. In other words, a signal can be collected for each excitation frame, and the signals can be combined to create a sub-diffraction limited image.

In one configuration, multiple super-oscillating peaks can be used, wherein each peak can be spaced from other peaks by a distance farther than the diffraction limit of the signal-detection optics.

FIGS. 8A-8B illustrate an exemplary technique for nanoscale imaging using a photoswitchable layer and a super-oscillating node. The technique described in FIGS. 8A-8B does not rely on fluorescent markers. Rather, the photoswitchable layer 804 can be placed on top of a sample 806 to be imaged, and in combination with the super-oscillating node, nanoscale imaging can be achieved.

As shown in FIG. 8A, the photoswitchable layer 804 can be placed on top of the sample 806 to be imaged. The photoswitchable layer 804 can be illuminated by a focused beam at $\lambda_1$ and a focused beam containing a super-oscillating node at $\lambda_2$. In other words, the photoswitchable layer 804 can be simultaneously illuminated by the wavelength $\lambda_1$ and the wavelength $\lambda_2$. In one example, the photoswitchable layer 804 can be initially illuminated by the wavelength $\lambda_1$, and then the photoswitchable layer 804 can be illuminated by the wavelength $\lambda_2$. An intensity and exposure times for the two beams can be selected, such that a deep sub-wavelength region that is transparent to $\lambda_1$ can be generated in the photoswitchable layer 804.

As shown in FIG. 8B, photons at $\lambda_1$ can penetrate through the photoswitchable layer 804 and interact with nanostructures in the sample 806 underneath. The transmitted signal at $\lambda_1$ can be transmitted downstream (without super-oscillations) A filter can be used to block $\lambda_2$ photons in front of a detector. In one example, relatively high resolution can be achieved in a manner similar to nanopatterning. By scanning the sample relative to the optics and collecting the signals, a sub-diffraction limited image can be created that is similar to the previous imaging techniques. In one configuration, the technique can be parallelized by using multiple super-oscillating nodes, wherein each node can be spaced from other nodes by a distance farther than the diffraction limit of the signal-detection optics.

Generation of Super-Oscillating Optical Fields

In general, a relatively large range is desirable in amplitudes of Fourier components in order to create super-oscillating functions. In optics, an attenuating phase-shifting optical element can be used when generating the super-oscillating optical fields. Various approaches are described herein to design such optics (in FIGS. 9-10). In one example, the optics can be designed such that their dimensions are within a few hundred microns. As a result, arrays containing a plurality of optical micro-elements can be created, thereby allowing for parallel nanopatterning and imaging as previously discussed. Alternatively, the approach described herein is applicable to macro-scale optical elements as well.

Figure 9A:
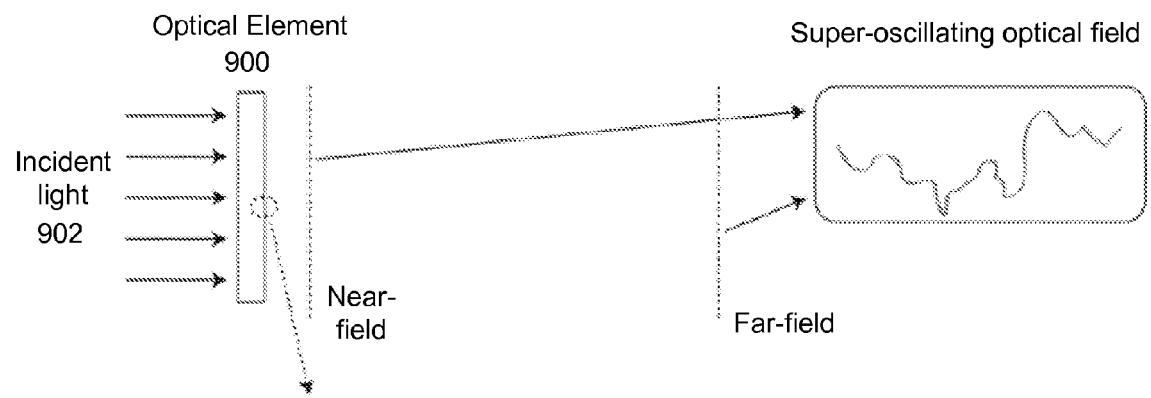
FIGS. 9A-9D illustrate diffractive lens configurations for generating super-oscillating optical fields in accordance with an embodiment of the present invention.

FIG. 9A illustrates an optical element 900 (e.g., a diffractive optic, optic array, super-oscillating lens array, single lens) that can be illuminated by a beam of incident light 902. The incident light 902 can be collimated or not collimated. In addition, the incident light 902 can be monochromatic or not monochromatic. An image can be comprised of the super-oscillating optical field. The image can be formed in a near-field, a far-field or a plane in between. The optical element 900 can be designed based on illumination conditions, as well as a location of the image relative to the optical element 900.

Figure 9B:
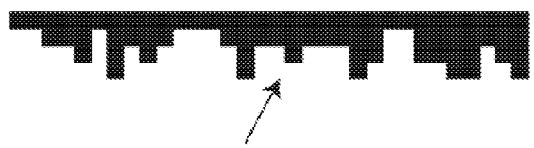

FIG. 9B illustrates an exemplary optical design that uses a multi-level patterned absorbing layer as a diffractive optic. The absorber can be a metal or a dielectric absorber. One key requirement includes a sufficient height difference in a topographic pattern. The sufficient height difference can enable a $\pi$ phase shift at a wavelength of interest, and in addition, allow for a plurality of orders of magnitude in absorption. In one example, the metal layer can be supported on a transparent substrate (not shown).

Figure 9C:
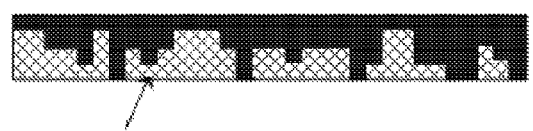
Figure 9D:
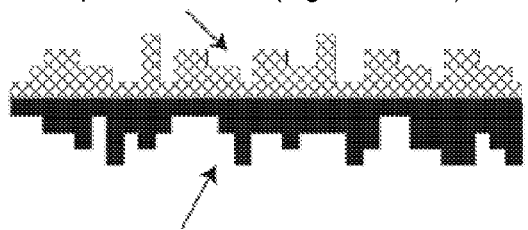

FIGS. 9C and 9D illustrate an alternative approach to designing such lenses. Two or more materials can be used, wherein a first material serves primarily as the absorbing layer and the second material serves as a phase-shifter (and is significantly transparent).

As shown in FIG. 9C, the optical design can be performed in a constrained fashion, where the phase-shifter (or transparent dielectric) is simply deposited on top of a patterned absorber layer. For example, a multi-level pattern in an absorber (e.g., metal) can be overfilled with a transparent dielectric. The vice-versa is also possible, where an absorber is deposited on top of a patterned phase-shifting layer.

FIG. 9D illustrates a fully constrained optical design. The transparent phase-shifter can be designed to have a different multi-level structure than the absorber. For example, a multi-level pattern can be etched into the absorber (e.g., metal). However, the optical design may take into account the absorption, as well as the phase-shift induced by each pixel of such an element.

FIGS. 10A-10G illustrate an exemplary optical design that uses a multi-level patterned absorbing layer as a diffractive optic (as illustrated in FIG. 9B). In one example, the absorber can be gold (Au). As an example, the wavelength can be 325 nanometer (nm) and a 45 nm super-oscillating peak can be achieved. As another example, the wavelength can be 325 nm and a 53 nm super-oscillating peak can be achieved.

Figure 10A:
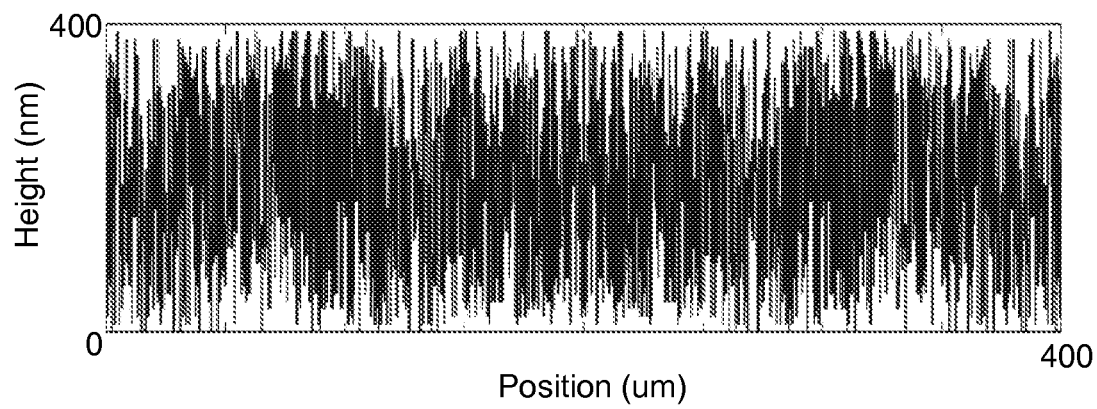
FIGS. 10A-10G illustrate an optical design in accordance with an embodiment of the present invention.
Figure 10B:
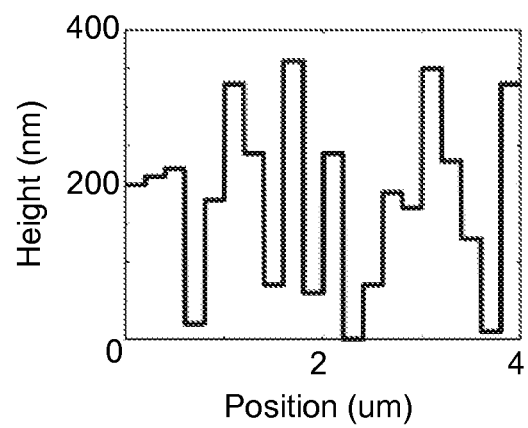
Figure 10C:
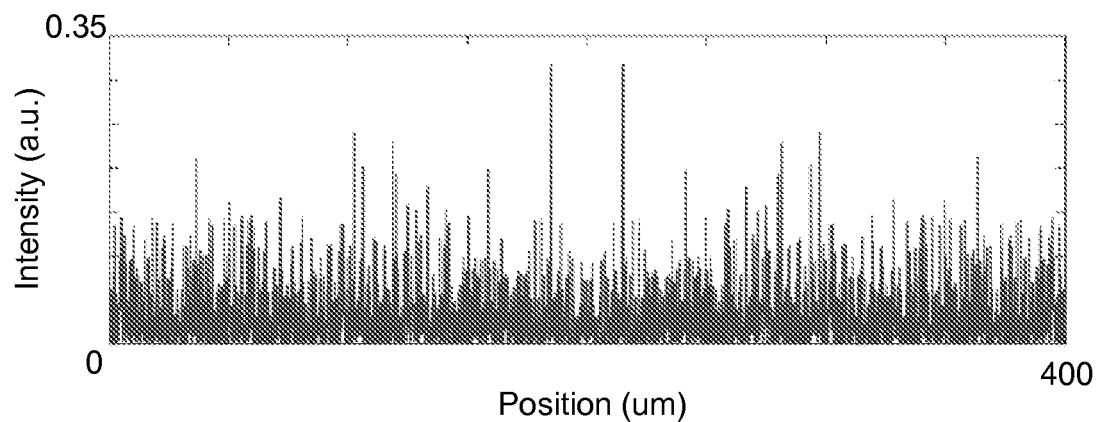
Figure 10D:
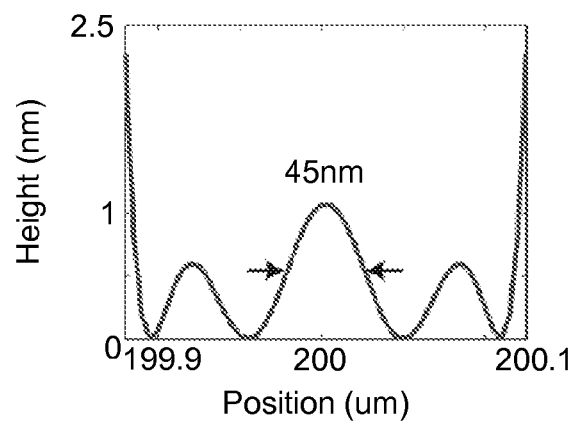
Figure 10E:
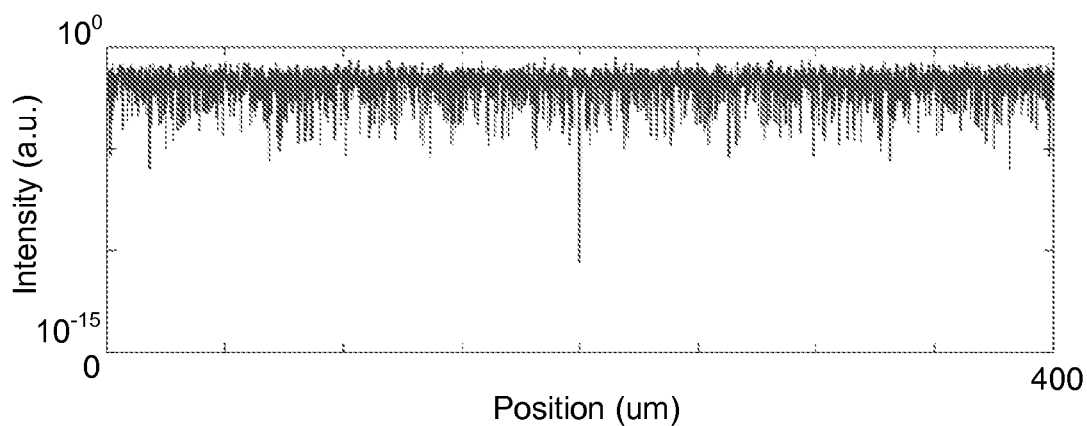
Figures 10F, 10G:
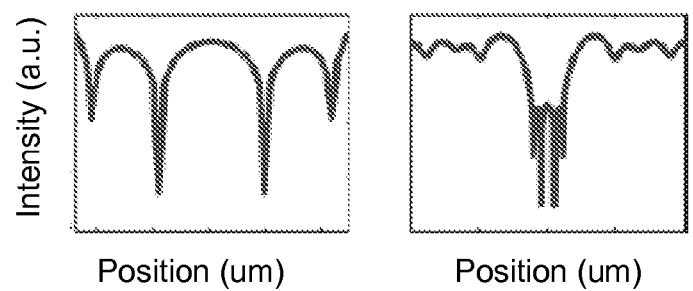

As shown in FIG. 10A, a one-dimensional multi-level structure can be designed using optimization techniques previously used for designing diffractive optics. A small region of the optic is shown in FIG. 10B. An image containing a super-oscillating peak is shown in FIG. 10C. A zoomed-in image of the super-oscillating peak with a width of 45 nm is shown in FIG. 10D. In an alternative example, the super-oscillating peak can have a width of 53 nm. FIGS. 10E and 10F illustrate the same images of the super-oscillating peaks in log scale. An intensity (and energy) within the super-oscillation can be several orders of magnitude smaller than background noise, as shown in FIG. 10G.

Exemplary Systems

A number of different optical systems can be utilized to implement the techniques described above. In one example, two wavelengths may be utilized either sequentially or simultaneously. A sample can be mounted on a stage in order to generate dense and arbitrary geometries. Simple two dimensional (2D) geometries can also be achieved by adding a rotational stage and/or a 2D (X-Y) stage.

Figure 11A:
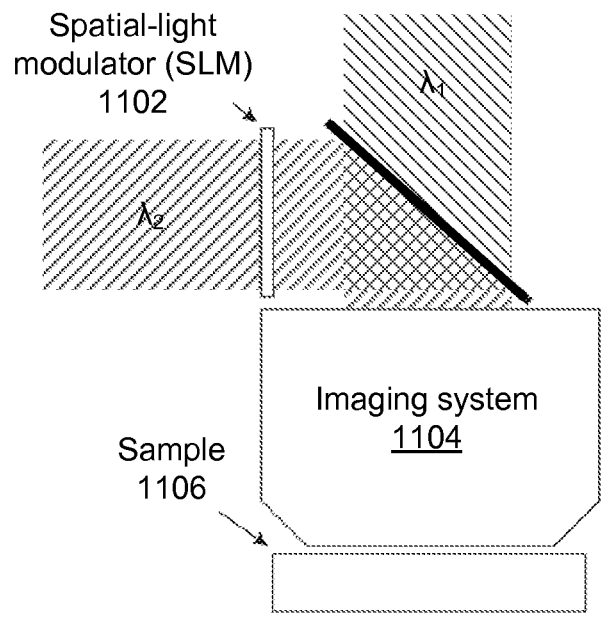
FIGS. 11A-11B illustrate optical systems in accordance with an embodiment of the present invention.
Figure 11B:
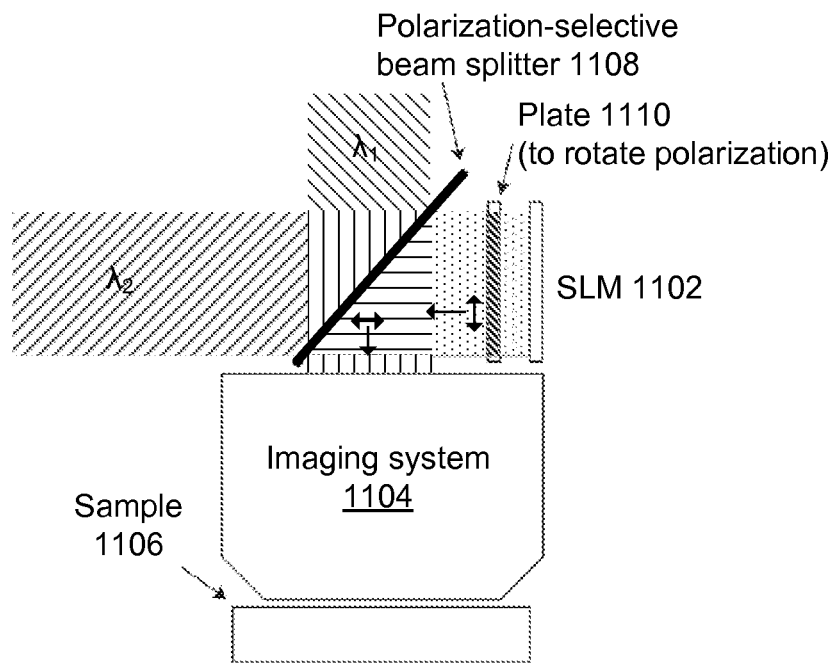

FIGS. 11A-11B illustrate exemplary optical systems that can be used to implement the techniques described above in two dimensions. In one example, the optical system can include a spatial-light modulator (SLM) 1102. The SLM 1102 can impose a form of spatially varying modulation on a beam of light. For example, the SLM 1102 can modulate the intensity of a light beam. In addition, the optical system can include a polarization-selective beam splitter 1108 and a plate 1110 to rotate polarization (e.g., a λ/4 plate).

In one example, the SLM 1102 can be used to create patterns within the $\lambda_2$ beam either in transmission (as shown in FIG. 11A) or in reflection (as shown in FIG. 11B). These patterns generate super-oscillating functions as long as sufficient dynamic range exists in the Fourier amplitudes. In one example, time-multiplexing can be used and distinct patterns can be applied to the two beams (not shown). An imaging system 1104 (which could be a microscope objective for instance) can focus the patterns into a relatively small region on the substrate as shown. In addition, the imaging system 1104 can mount the sample 1106 on a stage in order to generate dense and arbitrary geometries.

Figure 12A:
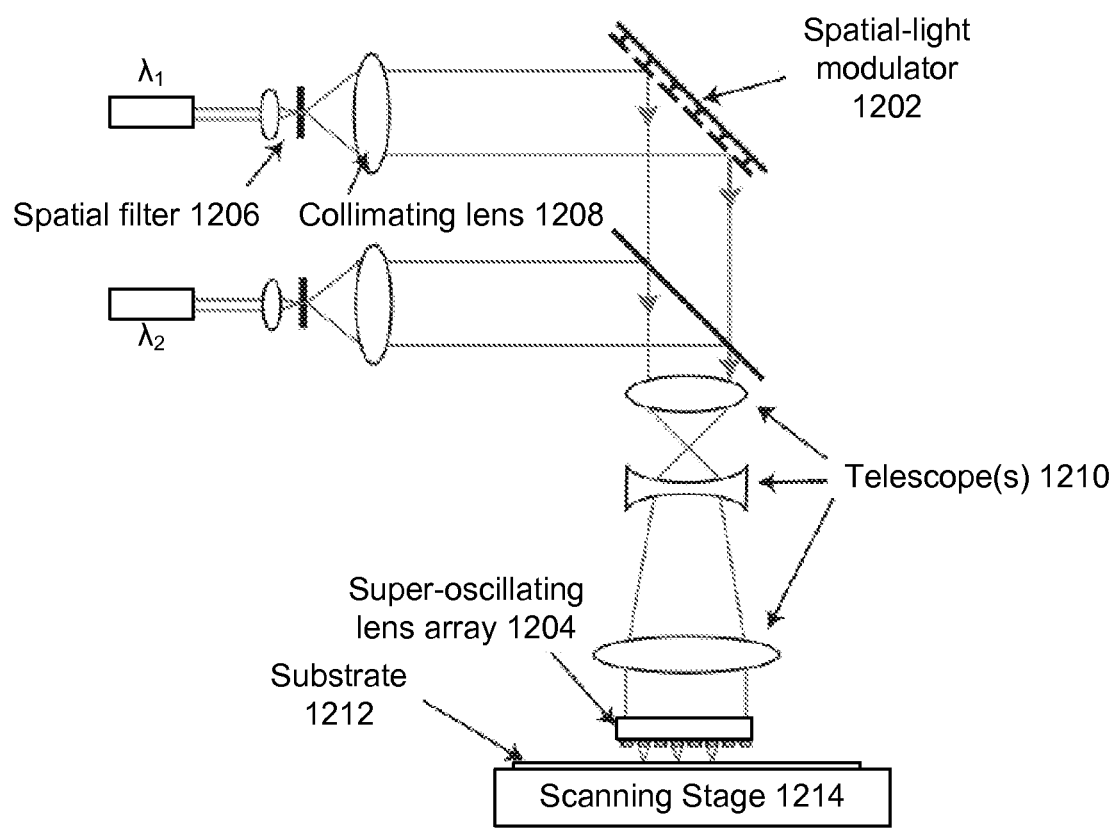
FIGS. 12A-12B illustrate optical systems in accordance with an embodiment of the present invention.
Figure 12B:
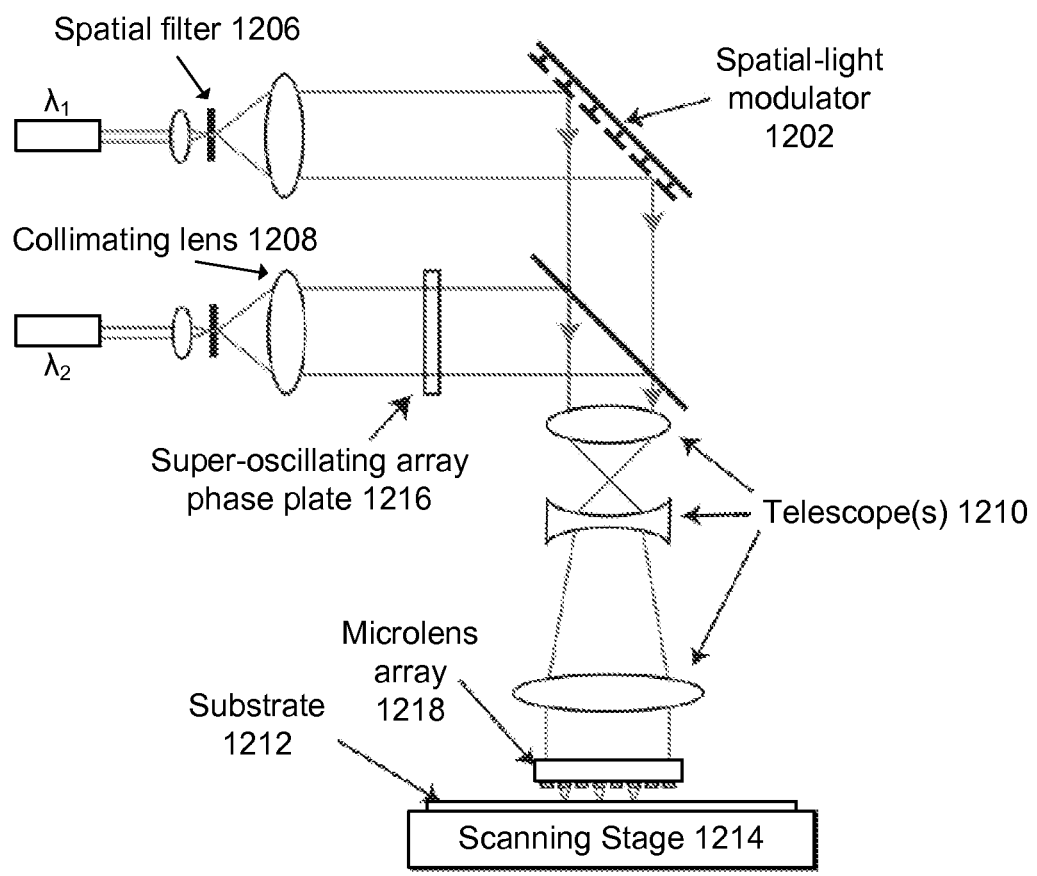

FIGS. 12A-12B illustrate exemplary optical systems, e.g., for dot-matrix type patterning using an array of super-oscillating lenses 1204 (or conventional microlenses). A spatial-light modulator (SLM) 1202 can be used to create independently controlled beamlets in the $\lambda_1$ beam as shown in FIG. 12A. An array of super-oscillating microlenses may be used that generate the desired super-oscillating function for the $\lambda_2$ beam (but only focuses the $\lambda_1$ beamlet). These super-oscillating microlenses may be similar to the lenses described in FIG. 10 (but also designed to account for $\lambda_1$). The optical system can include a spatial filter 1206 and a collimating lens 1208 for each of the wavelengths $\lambda_1$ and $\lambda_2$. The optical system can include a plurality of telescopes 1210. In addition, the optical system can be used to scan a sample (e.g., a substrate 1212) on a scanning state 1214.

FIG. 12B illustrates a slightly modified architecture of an exemplary optical system. A spatial-light modulator (SLM) 1202 can be used to create independently controlled beamlets in the $\lambda_1$ beam as shown in FIG. 12B. The optical system can include telescopes 1210 that are used to image beamlets from the SLM 1202 to each microlens in the array 1218. The optical system can include a spatial filter 1206 and a collimating lens 1208 for each of the wavelengths $\lambda_1$ and $\lambda_2$, as well as a super-oscillating array phase plate 1216 for the wavelength $\lambda_2$. In addition, the optical system can be used to scan a sample (e.g., a substrate 1212) on a scanning state 1214.

In one example, the micro lens array 1218 can focus both beams of light into an array of spots, and the phase plate in the $\lambda_2$ beam can produce super-oscillations in its corresponding spot. Thereby, an array of super-oscillating spots can be generated. The sample can be mounted on the scanning stage 1214 to enable dense patterning. In one example, the beams can be scanned relative to the sample instead. As the sample is moved (or beams scanned), the pixels of the SLM 1202 can be controlled such that the intensity in each of the $\lambda_1$ beamlets is controlled independently from fully-on to fully-off (and other levels in between). In one configuration, the SLM 1202 can be used in the $\lambda_2$ beam (not shown) if independent intensity control for that beam is desired. Complex patterns can be generated in a dot-matrix fashion. In addition, approaches for proximity-effect correction can be applied as well.

Figure 13:
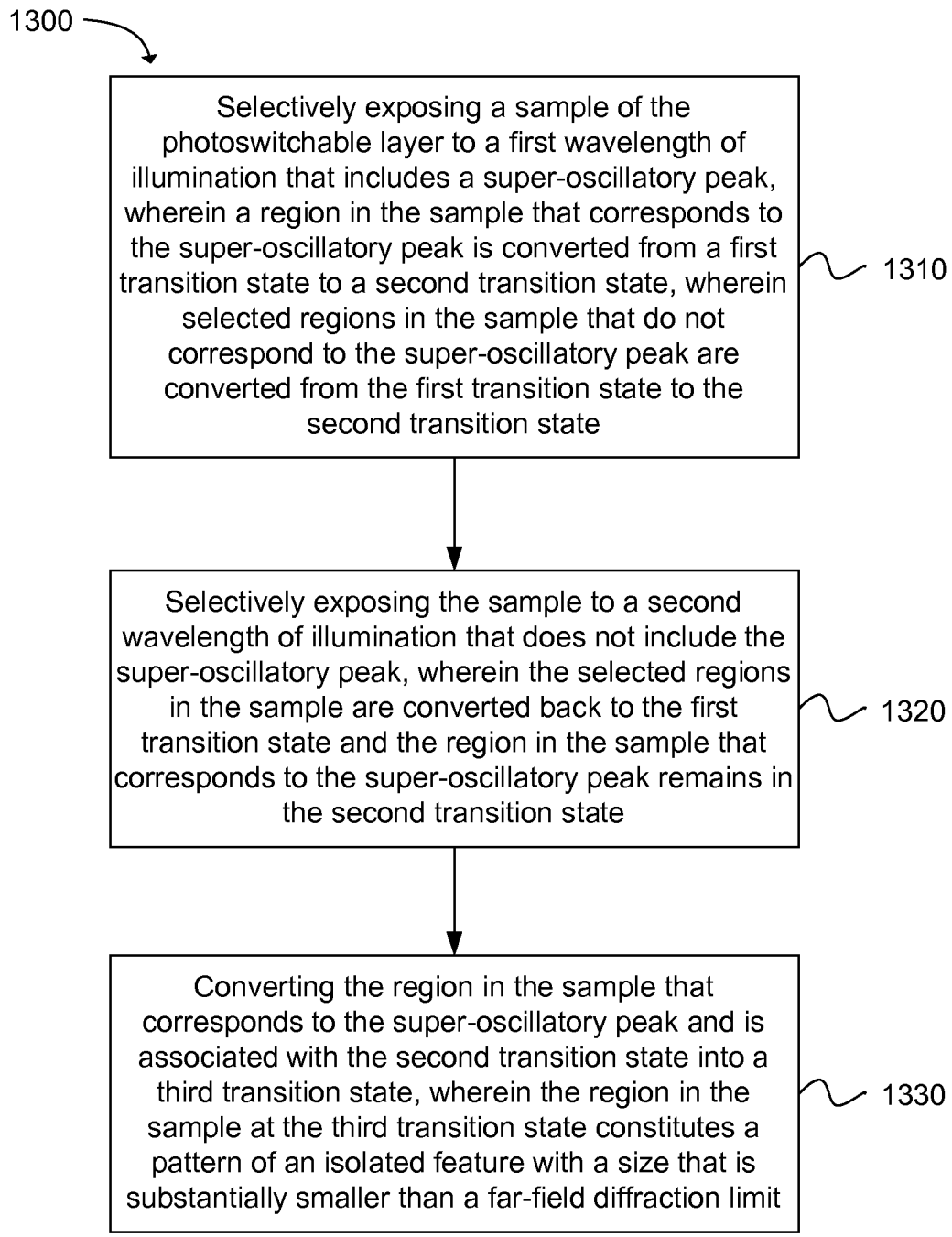
FIG. 13 depicts a flow chart of a method for sub-diffraction-limited patterning using a photoswitchable layer in accordance with an embodiment of the present invention.

FIG. 13 illustrates a flowchart of an exemplary method for sub-diffraction-limited patterning using a photoswitchable layer. The method can include the operation of selectively exposing a sample of the photoswitchable layer to a first wavelength of illumination that includes a super-oscillatory peak, wherein a region in the sample that corresponds to the super-oscillatory peak is converted from a first transition state to a second transition state, wherein selected regions in the sample that do not correspond to the super-oscillatory peak are converted from the first transition state to the second transition state, as in block 1310. The method can include the operation of selectively exposing the sample to a second wavelength of illumination that does not include the super-oscillatory peak, wherein the selected regions in the sample are converted back to the first transition state and the region in the sample that corresponds to the super-oscillatory peak remains in the second transition state, as in block 1320. The method can further include the operation of converting the region in the sample that corresponds to the super-oscillatory peak and is associated with the second transition state into a third transition state, wherein the region in the sample at the third transition state constitutes a pattern of an isolated feature with a size that is substantially smaller than a far-field diffraction limit, as in block 1330.

Figure 14:
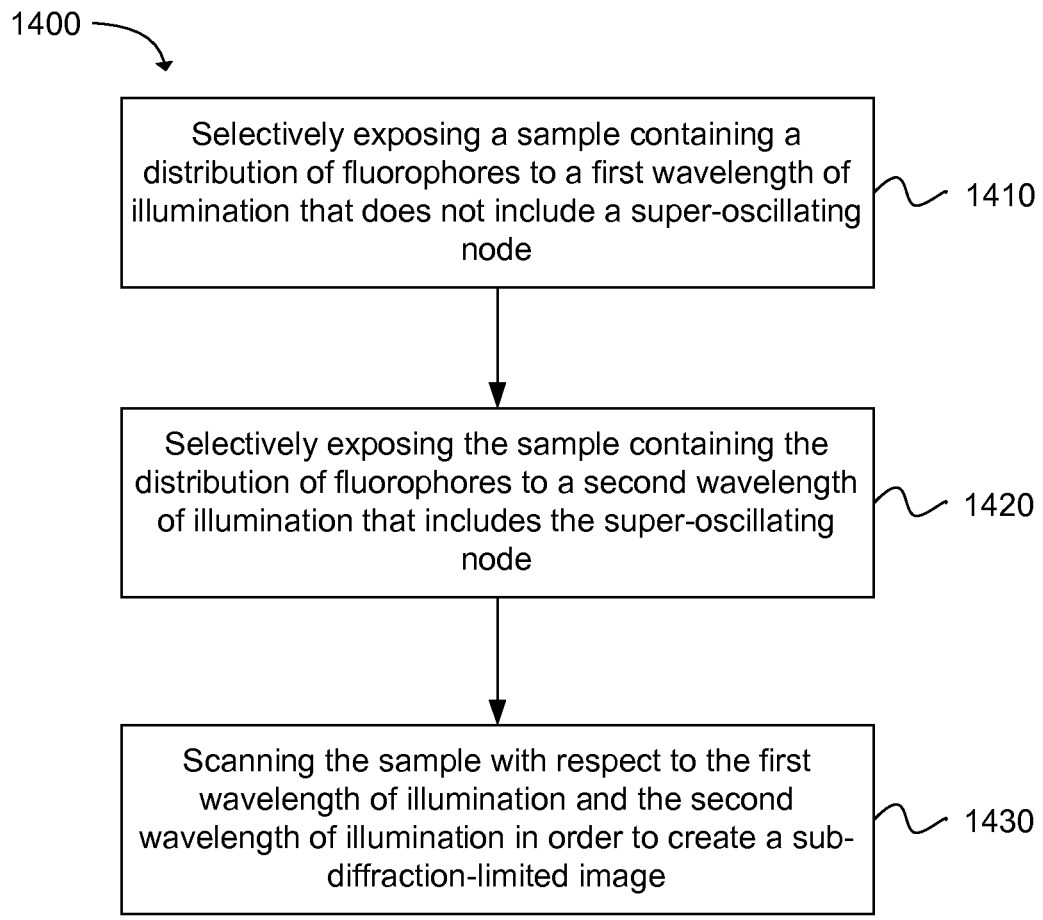
FIG. 14 depicts a flow chart of a method for sub-diffraction-limited imaging in accordance with an embodiment of the present invention.

FIG. 14 illustrates a flowchart of an exemplary method for sub-diffraction-limited imaging. The method can include the operation of selectively exposing a sample containing a distribution of fluorophores to a first wavelength of illumination that does not include a super-oscillating node, as in block 1410. The method can include the operation of selectively exposing the sample containing the distribution of fluorophores to a second wavelength of illumination that includes the super-oscillating node, as in block 1420. The method can further include the operation of scanning the sample with respect to the first wavelength of illumination and the second wavelength of illumination in order to create a sub-diffraction-limited image, as in block 1430.

Figure 15:
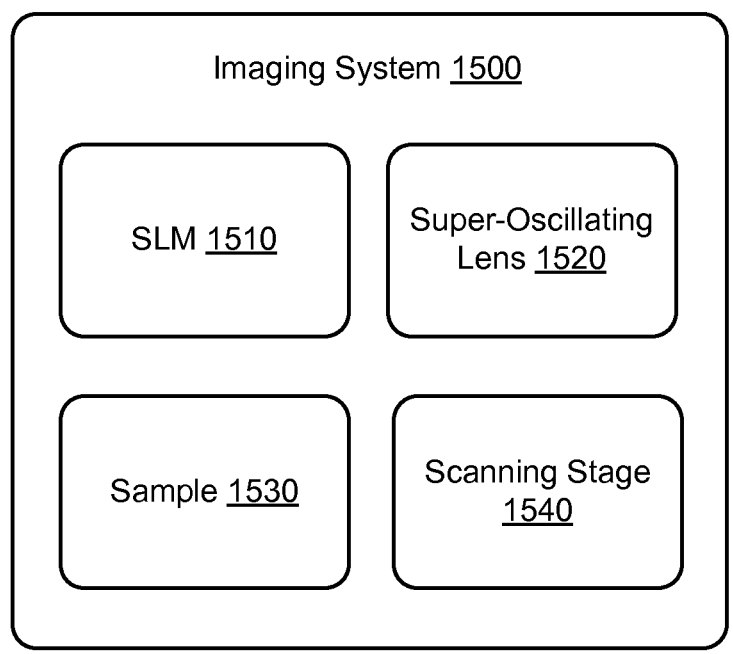
FIG. 15 is an illustration of an imaging system for performing sub-diffraction-limited patterning in accordance with an embodiment of the present invention.

FIG. 15 illustrates an exemplary imaging system 1500 operable to perform sub-diffraction-limited patterning. The imaging system 1500 can include a spatial light modulator (SLM) 1510 configured to produce at least two illuminations of light, wherein the illuminations of light include a first wavelength of illumination and a second wavelength of illumination. The imaging system 1500 can include a super-oscillating lens 1520 configured to generate a defined super-oscillating function for the second wavelength of illumination, wherein the second wavelength of illumination includes a super-oscillatory peak and the first wavelength of illumination does not include the super-oscillatory peak. The imaging system 1500 can include a sample 1530 that is selectively exposed to the first wavelength of illumination and the second wavelength of illumination such that a pattern from the sample 1530 is imaged with a size that is substantially smaller than a far-field diffraction limit. In addition, the imaging system 1500 can include a scanning stage 1540 on which the sample 1530 is mounted on in order to enable dense patterning of features with respect to the sample 1530.

Various techniques, or certain aspects or portions thereof, may take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A method for sub-diffraction-limited patterning using a photoswitchable layer, the method comprising:
    selectively exposing a sample of the photoswitchable layer to a first wavelength of illumination that includes a super-oscillatory peak, wherein a region in the sample that corresponds to the super-oscillatory peak is converted from a first transition state to a second transition state, wherein selected regions in the sample that do not correspond to the super-oscillatory peak are converted from the first transition state to the second transition state;
    selectively exposing the sample to a second wavelength of illumination that does not include the super-oscillatory peak, wherein the selected regions in the sample are converted back to the first transition state and the region in the sample that corresponds to the super-oscillatory peak remains in the second transition state.

2. The method of claim 1, further comprising, subsequent to the selectively exposing the sample to the second wavelength of illumination, converting the region in the sample that corresponds to the super-oscillatory peak and is associated with the second transition state into a third transition state, wherein the region in the sample at the third transition state constitutes a pattern of an isolated feature with a size that is substantially smaller than a far-field diffraction limit.

3. The method of claim 2, further comprising:
    displacing the sample in accordance with a defined displacement level; and
    selectively exposing the sample with the first wavelength of illumination and the second wavelength of illumination in order to obtain a second region in the sample at the third transition state, wherein the sample is repeatedly displaced by the defined displacement level and selectively exposed to the first wavelength and the second wavelength in order to create a plurality of regions in the third transition state that represent a dense set of features in the pattern, wherein a spacing between each of the features in the sample correspond to the defined displacement level and are substantially less than the far-field diffraction limit.

4. The method of claim 2, wherein the converting the region in the sample is accomplished by at least one of: dissolving the region in the sample, electrochemically oxidizing the region in the sample and chemically modifying the region in the sample.

5. The method of claim 2, further comprising:
    placing the photoswitchable layer on top of a photoresist layer in order to create the sample;
    performing a plurality of exposures on the sample with the first wavelength of illumination and the second wavelength of illumination in order to obtain a plurality of exposed regions in the photoresist layer that correspond to the third transition state; and
    removing the photoswitchable layer in order to reveal the photoresist layer with the plurality of exposed regions that that correspond to the third transition state, wherein the exposed regions represent a dense set of features in the pattern, wherein a spacing between each of the features in the sample correspond to a defined displacement level and are substantially less than the far-field diffraction limit.

6. The method of claim 1, wherein:
    the selectively exposing the sample to the first wavelength includes exposing the sample to the first wavelength of illumination for a first defined period and a first defined intensity level; and
    the selectively exposing the sample to a second wavelength includes exposing the sample to the second wavelength of illumination according to a second defined period and a second defined intensity level.

7. The method of claim 1, wherein the sample is simultaneously exposed to the first wavelength of illumination and the second wavelength of illumination.

8. The method of claim 1, wherein the sample is exposed to the first wavelength of illumination earlier in time as compared to the second wavelength of illumination.

9. The method of claim 1, further comprising performing the sub-diffraction-limited patterning in two dimensions or three dimensions.

10. The method of claim 1, further comprising generating a super-oscillating optical field that includes the super-oscillatory peak using an attenuating phase-shifting optical element.

11. The method of claim 1, further comprising generating the first wavelength of illumination and the second wavelength of illumination using a spatial-light modulator (SLM).

12. A method for sub-diffraction-limited imaging, the method comprising:
    selectively exposing a sample containing a distribution of fluorophores to a first wavelength of illumination that does not include a super-oscillating node;
    selectively exposing the sample containing the distribution of fluorophores to a second wavelength of illumination that includes the super-oscillating node; and
    scanning the sample with respect to the first wavelength of illumination and the second wavelength of illumination in order to create a sub-diffraction-limited image.

13. The method of claim 12, further comprising collecting fluorescent photons from a fluorophore that corresponds to a location of the super-oscillating node, wherein remaining fluorophores in the sample are quenched after exposure to the second wavelength of illumination that includes the super-oscillating node.

14. The method of claim 13, further comprising determining position information for the fluorophore that emits the fluorescent photons based on a known location associated with the super-oscillating node.

15. The method of claim 12, wherein the sample is selectively exposed to the first wavelength of illumination based on a diffraction-limited focal spot that is used to excite the fluorophores in the sample.

16. The method of claim 12, wherein a plurality of super-oscillating nodes are used to perform the sub-diffraction-limited imaging.

17. The method of claim 12, wherein a resolution below 10 nanometers (nm) with visible light is obtained when performing the sub-diffraction-limited imaging using super-oscillations.

18. An imaging system operable to perform sub-diffraction-limited patterning, the system comprising:
    a spatial light modulator (SLM) configured to produce at least two illuminations of light, wherein the illuminations of light include a first wavelength of illumination and a second wavelength of illumination;

a super-oscillating lens configured to generate a defined super-oscillating function for the second wavelength of illumination, wherein the second wavelength of illumination includes a super-oscillatory peak and the first wavelength of illumination does not include the super-oscillatory peak; and a sample that is selectively exposed to the first wavelength of illumination and the second wavelength of illumination such that a pattern from the sample is imaged with a size that is substantially smaller than a far-field diffraction limit.

19. The imaging system of claim 18, further comprising a scanning stage on which the sample is mounted on in order to enable dense patterning of features with respect to the sample.

20. The imaging system of claim 18, wherein the sample includes a photoswitchable layer.

21. The imaging system of claim 18, wherein the sample includes a photoswitchable layer that is positioned on top of a photoresist layer.

22. The imaging system of claim 18, wherein:

the sample is simultaneously exposed to the first wavelength of illumination and the second wavelength of illumination; or the sample is exposed to the first wavelength of illumination earlier in time as compared to the second wavelength of illumination.

23. The imaging system of claim 18, wherein:

the sample is selectively exposed to the first wavelength of illumination in accordance with a first defined period and a first defined intensity level; and the sample is selectively exposed to the second wavelength of illumination in accordance with a second defined period and a second defined intensity level.

* * * * *